(12) United States Patent
Charipadi et al.

(10) Patent No.: US 11,212,758 B2
(45) Date of Patent: Dec. 28, 2021

(54) GAIN CONTROL FOR A RADIO FREQUENCY (RF) FRONT-END OF BASE STATION

(71) Applicant: CommScope Technologies LLC, Hickory, NC (US)

(72) Inventors: Gopikrishna Charipadi, Bangalore (IN); Balaji B Raghothaman, Chester Springs, PA (US)

(73) Assignee: CommScope Technologies LLC, Hickory, NC (US)

( * ) Notice: Subject to any disclaimer, the term of this patent is extended or adjusted under 35 U.S.C. 154(b) by 282 days.

(21) Appl. No.: 16/085,526

(22) PCT Filed: Mar. 9, 2017

(86) PCT No.: PCT/US2017/021640
§ 371 (c)(1),
(2) Date: Sep. 14, 2018

(87) PCT Pub. No.: WO2017/160595
PCT Pub. Date: Sep. 21, 2017

(65) Prior Publication Data
US 2020/0205094 A1 Jun. 25, 2020

Related U.S. Application Data

(60) Provisional application No. 62/308,613, filed on Mar. 15, 2016.

(51) Int. Cl.
*H04W 52/52* (2009.01)
*H04B 17/336* (2015.01)
*H04L 1/00* (2006.01)
*H04W 52/24* (2009.01)
*H04W 88/08* (2009.01)

(52) U.S. Cl.
CPC .......... *H04W 52/52* (2013.01); *H04B 17/336* (2015.01); *H04L 1/0003* (2013.01); *H04W 52/241* (2013.01); *H04W 88/085* (2013.01)

(58) Field of Classification Search
CPC .. H04W 52/52; H04L 1/0003; H04L 27/2601; H04L 1/0009
See application file for complete search history.

(56) References Cited

U.S. PATENT DOCUMENTS 9,112,471 B1 8/2015 Jain et al.
9,124,234 B1 9/2015 Petrovic
(Continued)

FOREIGN PATENT DOCUMENTS

| CN | 101959204 A | 1/2011 |
|---|---|---|
| CN | 102057568 A | 5/2011 |
| CN | 102187588 A | 9/2011 |

OTHER PUBLICATIONS

International Searching Authority, "International Search Report and Written Opinion from PCT Application No. PCT/US2017/021640 dated Jun. 19, 2017," pp. 1-16; Published in WO.
(Continued)

*Primary Examiner* — Kevin C. Harper
*Assistant Examiner* — Mon Cheri S Davenport
(74) *Attorney, Agent, or Firm* — Fogg & Powers LLC

(57) ABSTRACT

One embodiment is directed to controlling a gain for a receive signal path for receiving wireless signals. The following are repeatedly performed: determining an estimate of the total noise and interference in a received signal and determining a gain value for the receive signal path based on the estimate of the total noise and interference in order to maintain the digital data at a digital set point for a signal-to-interference-plus-noise-ratio (SINR) decoded with a highest modulation and coding scheme specified for the wireless channel. Another embodiment is directed to determining a received signal strength of the signals received at the receive signal path and determining a gain value for the receive signal path based on the received signal strength that
(Continued)

maintains the digital data at a digital set point for a SINR sufficient to decode the MCS specified for the wireless channel.

44 Claims, 6 Drawing Sheets

(56) References Cited

U.S. PATENT DOCUMENTS

| | | | |
|---|---|---|---|
| 2002/0045459 A1 | 4/2002 | Morikawa | |
| 2004/0052320 A1 | 3/2004 | Lennen | |
| 2005/0079842 A1 | 4/2005 | Shi | |
| 2009/0290516 A1 | 11/2009 | Han et al. | |
| 2012/0276896 A1* | 11/2012 | Ren | H04L 1/0009 455/423 |
| 2013/0044842 A1 | 2/2013 | Wang et al. | |
| 2013/0309988 A1 | 11/2013 | Ji et al. | |
| 2014/0010267 A1* | 1/2014 | Jacob | H04L 1/20 375/219 |

OTHER PUBLICATIONS

European Patent Office, "Extended European Search Report from EP Application No. 17767192.2", from Foreign Counterpart to U.S. Appl. No. 16/085,526, dated Sep. 27, 2019, pp. 1-8, Published: EP.

China National Intellectual Property Administration, "First Office Action from CN Application No. 201780017335.6", from Foreign Counterpart to U.S. Appl. No. 16/085,526, dated Jun. 22, 2020, pp. 1 through 26, Published: CN.

European Patent Office, "Communication pursuant to Article 94(3) from EP Application No. 17767192.2", from Foreign Counterpart to U.S. Appl. No. 16/085,526, dated Jul. 15, 2020, pp. 1 through 4, Published: EP.

Korean Intellectual Property Office, "Non-Final Rejected from KR Application No. 10-2018-7029595", from Foreign Counterpart to U.S. Appl. No. 16/085,526, dated Jan. 21, 2021, pp. 1 through 20, Published: KR.

China National Intellectual Property Administration, "Second Office Action from CN Application No. 201780017335.6", from Foreign Counterpart to U.S. Appl. No. 16/085,526, dated Apr. 30, 2021, pp. 1 through 17, Published: CN.

Korean Intellectual Property Office, "Notice of Non-Final Rejection from KR Application No. 10-2018-7029595", from Foreign Counterpart to U.S. Appl. No. 16/085,526, dated Jul. 15, 2021, pp. 1 through 6, Published: KR.

China National Intellectual Property Administration, "Rejection Decision from CN Application No. 201780017335.6", from Foreign Counterpart to U.S. Appl. No. 16/085,526, filed Oct. 9, 2021, pp. 1 through 14, Published: CN.

\* cited by examiner

GAIN CONTROL FOR A RADIO FREQUENCY (RF) FRONT-END OF BASE STATION

CROSS-REFERENCE TO RELATED APPLICATION

This application is a U.S. National Stage application of International Patent Application No. PCT/US2017/021640 filed on Mar. 9, 2017, which claims the benefit of U.S. Provisional Patent Application Ser. No. 62/308,613 filed on Mar. 15, 2016, both of which are hereby incorporated herein by reference in their entirety.

BACKGROUND

A radio frequency (RF) front end (also referred to here as a "radio") typically includes a receive signal path and a transmit signal path.

The receive signal path of the RF front end typically includes one or more variable gain elements that can be used to adjust the gain of RF signals received using that radio.

Radios typically employ automatic gain control (AGC) to automatically adjust the receive-path signal gain for RF signals that may be received at different signal strengths. Automatic gain control typically dynamically adjusts the receive-path gain so that the resulting amplified signal (or signals) presented as an input to an analog-to-digital converter (ADC) is at a nominal level. The nominal level of the ADC is also referred to here as the "analog set point." The analog set point is based on the dynamic range of the ADC so that strong received RF signals do not saturate the ADC and so that weak received RF signals do not fall below the noise floor for the channel, close to the quantization noise of the ADC (for example, ½ least significant bit (LSB)).

However, such a traditional approach to automatic gain control may not be effective in all applications.

One example can occur in the uplink of a wireless RF channel implemented using a Long Term Evolution (LTE) air interface. This can occur when a sub-frame having a high resource block (RB) occupancy immediately follows a sub-frame having low resource block occupancy. During the low-RB occupancy sub-frame (N−1), a very low time-domain average power will be measured. This can result in the AGC applying a high gain (for example, the maximum possible gain) to the receive signal path in order to boost the power of the amplified signal (or signals) presented as the input to the ADC. The latency that exists in the AGC between when the low power is measured and the application of the high gain to the receive signal path can result in the high gain being applied to the high-RB occupancy sub-frame. However, applying a high-gain to a high-RB occupancy sub-frame can cause the amplified signal presented as the input to the ADC to saturate the ADC. This can result in block errors and, as a result, an increase in radio link failures in the uplink.

SUMMARY

One embodiment is directed to a method of controlling a gain for a receive signal path for receiving a signal communicated over a wireless channel. An input to an analog-to-digital converter (ADC) is generated in the receive signal path, the ADC outputting digital data used for digital signal processing. The method comprises, repeatedly performing the following: determining an estimate of the total noise and interference in a signal received using the receive signal path; determining a gain value for the receive signal path based on the estimate of the total noise and interference in order to maintain the digital data at a digital set point for a signal-to-interference-plus-noise-ratio (SINR) decoded with a highest modulation and coding scheme (MCS) specified for the wireless channel; and causing the receive signal path to use the gain value as the gain for the receive signal path.

Another embodiment is directed to a method of controlling a gain for a receive signal path for receiving a signal communicated over a wireless channel. An input to an analog-to-digital converter (ADC) is generated in the receive signal path, the ADC outputting digital data used for digital signal processing. The method comprises, repeatedly performing the following: determining a received signal strength of the signal received at the receive signal path; determining a gain value for the receive signal path based on the received signal strength that maintains the digital data at a digital set point for a signal-to-interference-plus-noise-ratio (SINR) sufficient to decode the modulation and coding scheme (MCS) specified for the wireless channel; and causing the receive signal path to use the gain value as the gain for the receive signal path.

Another embodiment is directed to a wireless system comprises a radio frequency (RF) front end circuit comprising a receive signal path to receive a signal communicated over a wireless channel. The system further comprises an analog-to-digital converter (ADC). An input to the ADC is generated in the receive signal path. The system further comprises a baseband modem to perform digital signal processing. The ADC outputs digital data used for the digital signal processing. The wireless system is configured to repeatedly perform the following: determine an estimate of the total noise and interference in the signal received using the receive signal path; determine a gain value for the receive signal path based on the estimate of the total noise and interference in order to maintain the digital data at a digital set point for a signal-to-interference-plus-noise-ratio (SINR) decoded with a highest modulation and coding scheme (MCS) specified for the wireless channel; and cause the receive signal path to use the gain value as the gain for the receive signal path.

Another embodiment is directed to a wireless system comprising a radio frequency (RF) front end circuit comprising a receive signal path to receive a signal communicated over a wireless channel. The system further comprises an analog-to-digital converter (ADC), wherein an input to the ADC is generated in the receive signal path. The system further comprises a baseband modem to perform digital signal processing. The ADC outputs digital data used for the digital signal processing. The wireless system is configured to repeatedly perform the following: determine a received signal strength of the signal received at the receive signal path; determine a gain value for the receive signal path based on the received signal strength that maintains the digital data at a digital set point for a signal-to-interference-plus-noise-ratio (SINR) sufficient to decode the modulation and coding scheme (MCS) specified for the wireless channel; and cause the receive signal path to use the gain value as the gain for the receive signal path.

Another embodiment is directed to a scalable wireless system comprising a controller configured to communicate with a core network, the controller comprising a controller baseband modem. The system further comprises a plurality of radio points communicatively coupled to the controller. Each of the plurality of radio points comprises a respective radio frequency (RF) front end circuit comprising a respective receive signal path to receive a signal communicated over a wireless channel. Each of the plurality of radio points further comprises a respective analog-to-digital converter (ADC). A respective input to the respective ADC is generated in the receive signal path. Each of the plurality of radio points further comprises a respective radio-point baseband modem to perform digital signal processing. The respective ADC outputs respective digital data used for the digital signal processing. The radio-point baseband modem is configured to: autonomously determine, without involvement of controller baseband modem, a gain value for the receive signal path based on a received signal strength that maintains the digital data at a digital set point for a signal-to-interference-plus-noise-ratio (SINR) sufficient to decode the modulation and coding scheme (MCS) specified for the wireless channel; and cause the receive signal path to use the gain value as the gain for the receive signal path.

Another embodiment is directed to a method of controlling a gain for a receive signal path for receiving a signal communicated over a wireless channel. An input to an analog-to-digital converter (ADC) is generated in the receive signal path, the ADC outputting digital data used for digital signal processing. The method comprises determining an estimate of the total noise and interference in a signal received using the receive signal path, and controlling the gain in the receive signal path, based on the estimate of the total noise and interference, in order to limit the gain so as to increase throughput in the wireless channel for burst traffic where high resource block occupancy subframes follow low resource block occupancy subframes.

Another embodiment is directed to a wireless system comprising a radio frequency (RF) front end circuit comprising a receive signal path to receive a signal communicated over a wireless channel. The system further comprises an analog-to-digital converter (ADC). An input to the ADC is generated in the receive signal path. The system further comprises a baseband modem to perform digital signal processing. The ADC outputs digital data used for the digital signal processing. The wireless system is configured to: determine an estimate of the total noise and interference in the signal received using the receive signal path; and control the gain in the receive signal path, based on the estimate of the total noise and interference, in order to limit the gain so as to increase throughput in the wireless channel for burst traffic where high resource block occupancy subframes follow low resource block occupancy subframes.

Another embodiment is directed to a method of controlling a gain for a receive signal path for receiving a signal communicated over a wireless channel. An input to an analog-to-digital converter (ADC) is generated in the receive signal path, the ADC outputting digital data used for digital signal processing. The method comprises determining a received signal strength of the signal received at the receive signal path, and controlling the gain in the receive signal path, based on the received signal strength, in order to limit the gain so as to increase throughput in the wireless channel for burst traffic where high resource block occupancy subframes follow low resource block occupancy subframes.

Another embodiment is directed to a wireless system comprising a radio frequency (RF) front end circuit comprising a receive signal path to receive a signal communicated over a wireless channel. The system further comprises an analog-to-digital converter (ADC). An input to the ADC is generated in the receive signal path. The system further comprises a baseband modem to perform digital signal processing. The ADC outputs digital data used for the digital signal processing. The wireless system is configured to: determine a received signal strength of the signal received at the receive signal path, and control the gain in the receive signal path, based on the received signal strength, in order to limit the gain so as to increase throughput in the wireless channel for burst traffic where high resource block occupancy subframes follow low resource block occupancy subframes.

The details of various embodiments are set forth in the accompanying drawings and the description below. Other features and advantages will become apparent from the description, the drawings, and the claims.

DRAWINGS

Like reference numbers and designations in the various drawings indicate like elements.

DETAILED DESCRIPTION

Figure 1:
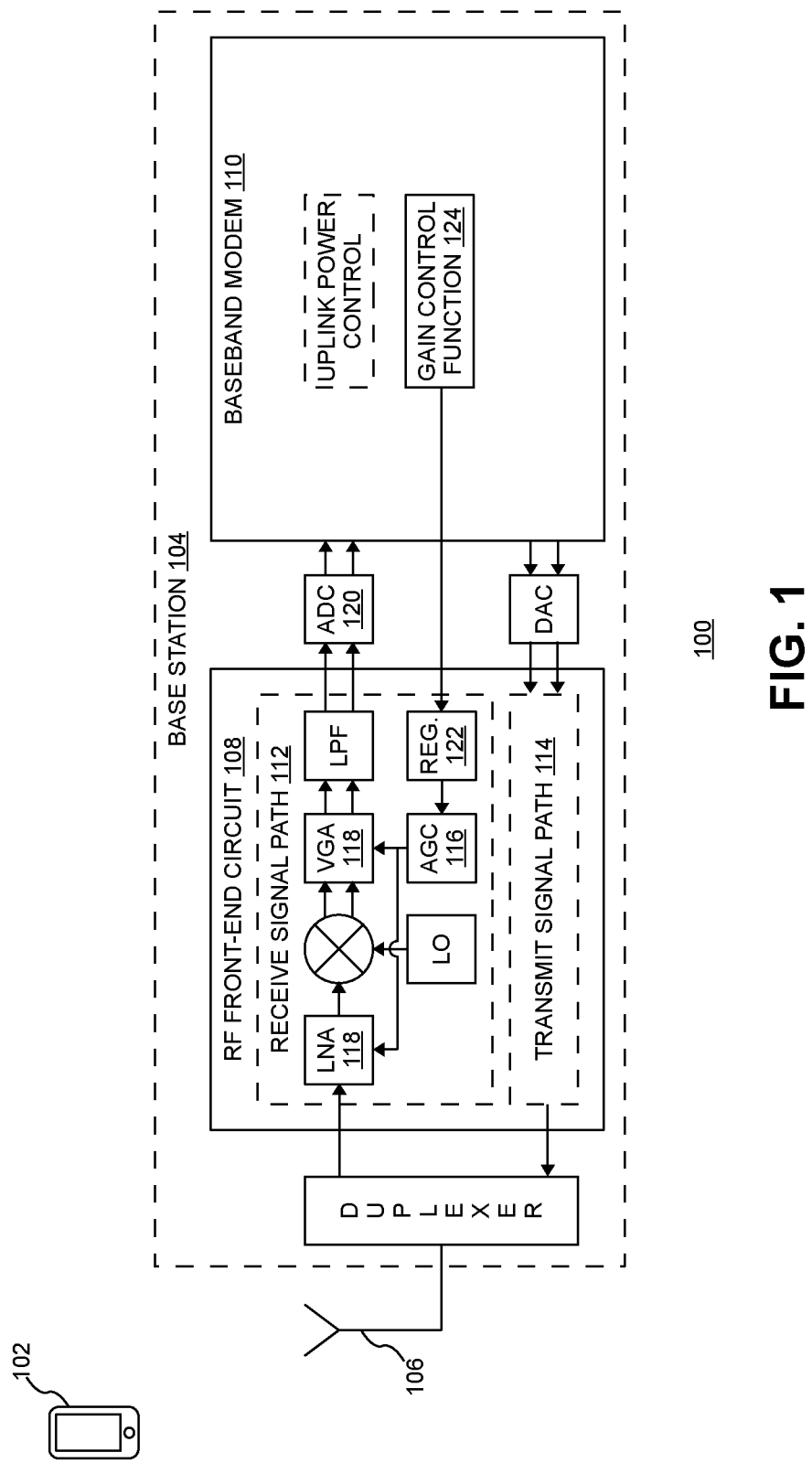
FIG. 1 is a block diagram of one exemplary embodiment of a wireless system.

FIG. 1 is a block diagram of one exemplary embodiment of a wireless system 100 in which the gain control techniques described here can be used.

In the exemplary embodiment shown in FIG. 1, user equipment (UE) 102 wirelessly communicates with a base station 104 over a wireless channel. The exemplary embodiment shown in FIG. 1 is described here as being implemented in a Long-Term Evolution (LTE) system that uses a LTE wireless air interface defined by the 3rd Generation Partnership Project (3GPP). However, is to be understood that other embodiments can be implemented in other ways (for example, using other air interfaces).

The base station 104 is implemented using one or more nodes that implement the various base-station functions necessary to implement the LTE air-interface and to interact with a wireless network operator's core network (not shown). In the following description, the one or more nodes that implement the base station 104 are referred to collectively as the "base station 104" for ease of explanation; however, it is to be understood that the various elements of the base station 104 described here can be implemented in different nodes.

Figure 2:
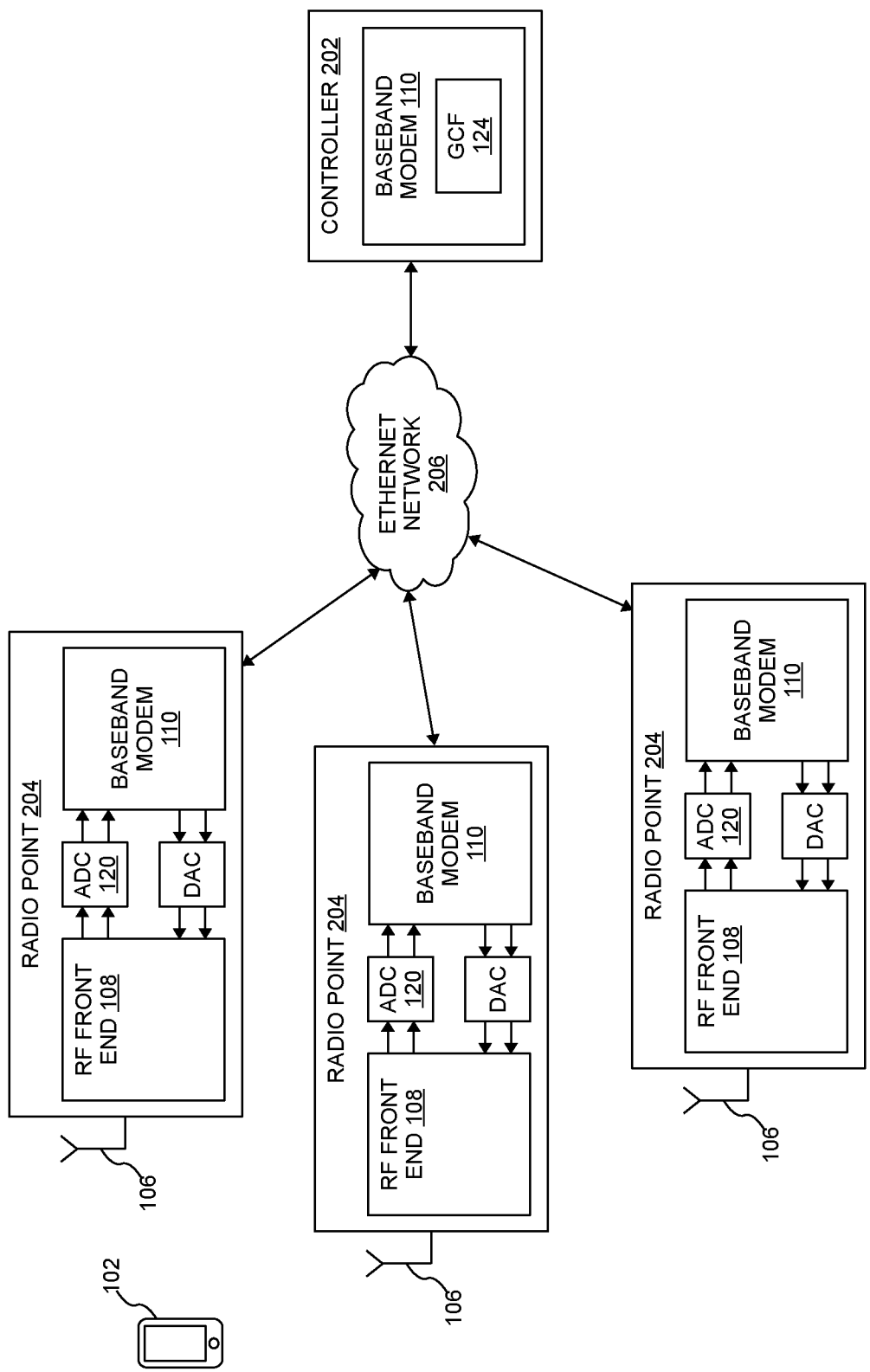
FIG. 2 is a block diagram of one exemplary embodiment of a distributed point-to-multipoint base system.

One example is shown in FIG. 2. In the example shown in FIG. 2, the base station 104 is implemented using multiple nodes in a point-to-multipoint distributed base station architecture. In this example, a portion of the base station functions are implemented by a central unit (also referred to as a "controller") 202 and a portion of the base station functions are implemented by multiple remote units (also referred to here as "radio points") 204 that are located remotely from the controller 202. In this example, the controller 202 is communicatively coupled to the radio points 204 using an Ethernet network 206. Details regarding such an architecture can be found in U.S. patent application Ser. No. 13/762,283, filed on Feb. 7, 2013, and titled "RADIO ACCESS NETWORKS," which is hereby incorporated herein by reference.

The base station 104 can be implemented in other ways (for example, as a traditional monolithic macro or small cell base station).

In general, the base station 104 (shown in FIG. 1) includes or is coupled to one or more antennas 106 via which downstream RF signals are radiated to user equipment 102 and via which upstream RF signals transmitted by user equipment 102 are received. The base station 104 includes one or more radio frequency (RF) front-end circuits 108 that implement the RF front-end functions for the air interface and the one or more antennas 106 associated with that base station 104. In this example, only a single RF front-end circuit 108 and antenna 106 are shown for ease of explanation; however, it is to be understood that the base station 104 can include multiple RF front-end circuits 108 and/or antennas 106 (for example, where a multiple-input-multiple-out (MIMO) LTE air interface is used).

The base station 104 also includes one or more baseband modems or units 110 that perform digital Layer-1, Layer-2, and Layer-3 processing for the LTE air interface. In the FIG. 1, a single baseband modem 110 is shown; however, it is to be understood, that the functionality of the baseband modem 110 can be implemented in a distributed manner. For example, in the example shown in FIG. 2, the functionality of the baseband modem 110 is implemented in both the controller 202 and the radio points 204. In this example, the baseband modem 110 in the controller 202 perform all of the digital Layer-3, Layer-2, and Layer-1 processing for the LTE air interface except for the inverse fast Fourier transform (IFFT) in the downstream and the fast Fourier transform (FFT) in the upstream. In this example, the baseband modem 110 in each radio point (RP) 204 implement the digital Layer-1 processing for the LTE air interface that is not performed in the controller 202 (that is, performs the IFFT in the downstream and the FFT in the upstream).

The functionality implemented by the baseband modem 110 can be implemented in other ways (for example, where the controller 202 implements all of the functionality of the baseband modem 110 or where the base station 104 is implemented as a monolithic small cell or macro base station).

Each RF front-end circuit 108 includes an uplink or receive signal path 112 and a downlink or transmit signal path 114. The receive signal path 112 implements an automatic gain control (AGC) function 116 that is used to dynamically adjust the gain of one or more variable gain or attenuation elements 118 in the received signal path 112. One or more power detectors (not shown) are included in the receive signal path 112 to determine the power at various points in the receive signal path for use by the AGC function 116.

The base station 104 also includes one or more analog-to-digital converters (ADC) 120. In the exemplary embodiment shown in FIG. 1, the ADC 120 is shown as being separate from the RF front-end circuit 108. However, it is to be understood that the ADC 120 can be included as a part of the RF front-end circuit 108 or the baseband modem 110.

In the exemplary embodiment shown in FIG. 1, the receive signal path 112 in the RF front-end circuit 108 receives an input RF signal from a respective antenna 106 (for example, via a duplexer). The receive signal path 112 amplifies the received RF signal (for example, using a low noise amplifier (LNA) included in the variable gain elements 118) and down-converts the amplified RF signal to produce analog baseband in-phase (I) and quadrature (Q) signals (for example, using mixers and local oscillators). The receive signal path 112 also amplifies the analog I and Q signals (for example, using a variable gain amplifier included in the variable gain elements 118) and filters the amplified analog I and Q signals, which are then presented as inputs to the ADC 120.

In the following description, the signals that are handled by the receive signal path 112 of the RF front-end circuit 108 and the ADC 120 are described in the singular form for ease of explanation. However, it is to be understood, that multiple signals can be handled (for example, where I and Q signals are created from the received RF signal).

The one or more RF circuits 108 can be implemented using one or more RF integrated circuits (RFICs) and/or discrete components. The RF circuit 108 can be implemented in other ways.

The one or more baseband modems 110 can be implemented in software or firmware executing on one or more suitable programmable processors. The one or more baseband modems 110 (or portions thereof) can be implemented in other ways (for example, in a field programmable gate array (FPGA), application specific integrated circuit (ASIC), etc.).

The AGC function 116 dynamically adjusts the receive-path gain so that the resulting amplified signal presented as an input to the ADC 120 is at a fixed nominal level. The fixed nominal level of the ADC 120 is also referred to here as the "analog set point."

The maximum gain that the AGC function 116 applies to the variable gain or attenuation elements 118 in the receive signal path 112 can be adjusted. Typically, a fixed maximum gain setting is used.

In this exemplary embodiment, the RF front-end circuit 108 includes a register 122 that stores a maximum gain setting for the AGC function 116. That is, the maximum gain applied by the AGC function 116 is configured based on the value stored in the register 122. This register 122 is also referred to here as the "maximum gain register 122."

In the example shown in FIG. 1, the maximum gain register 122 is shown as being a part of the RF front-end circuit 108 (for example, as a part of an RFIC that implements the RF front-end circuit 108). It is to be understood that the maximum gain register 122 can be a part of a different part of the base station 104 (for example, gain could be explicitly controlled in the baseband modem 110 in a software AGC implementation).

Moreover, in other embodiments, the maximum gain that the AGC function 116 uses can be configured in other ways.

The wireless air-interface that the UE 102 and base station 104 use for communicating over the wireless channel typically defines uplink transmit power control features. In general, the uplink transmit power control features of the wireless air-interface are used to instruct the UE 102 to dynamically adjust the uplink transmit power of the UE 102 so that the resulting digital input data used for digital signal processing in the baseband modem 110 is at a nominal level for a signal-to-interference-plus-noise-ratio (SINR) required for the highest modulation and coding scheme (MCS) specified for the wireless air interface. This nominal level is also referred to here as the "digital set point."

In this exemplary embodiment, the base station 104 includes a gain control function (GCF) 124 that is configured to dynamically reprogram the maximum gain of the AGC function 116. The gain control function 124 dynamically reprograms the maximum gain of the AGC function 116 to maintain the digital data used as an input for the digital signal processing performed in the baseband modem 110 at the digital set point.

Figure 3:
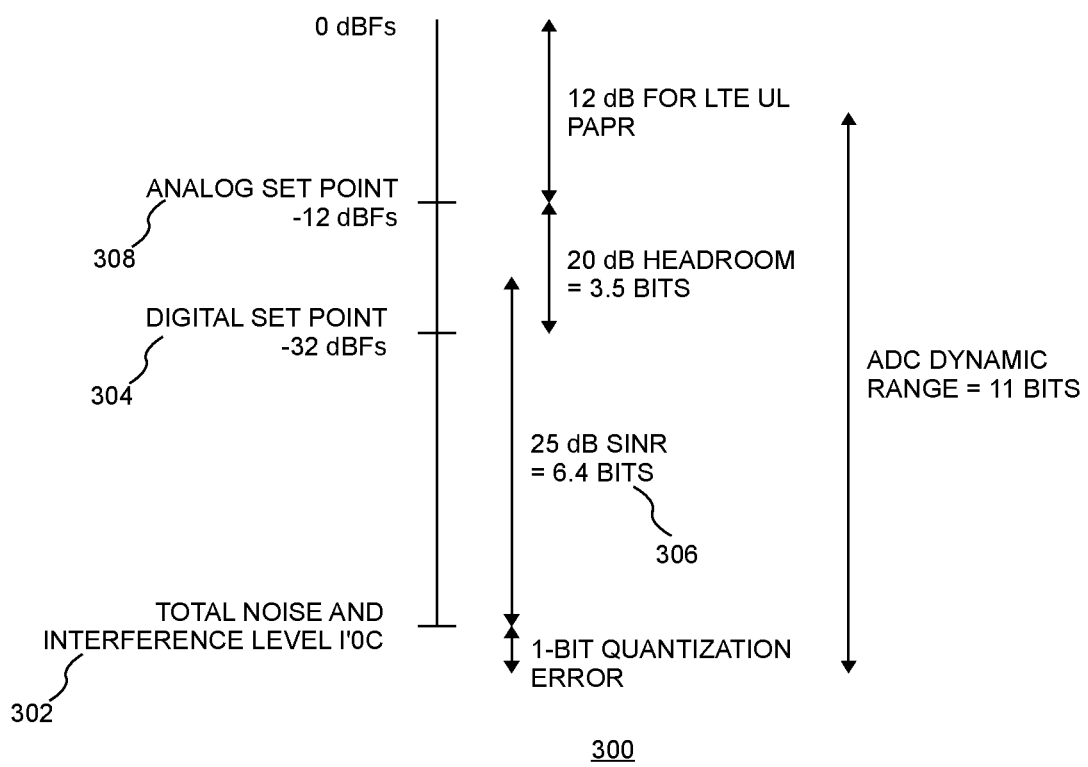
FIG. 3 illustrates how one exemplary embodiment of a budget for the dynamic range of the ADC of the system shown in FIG. 1.

FIG. 3 illustrates how one exemplary embodiment of a budget 300 for the dynamic range of the ADC 120 from FIG. 1. This example is described here in connection with the system of FIG. 1 where the wireless air interface is LTE.

The total noise and interference power in the relevant LTE bandwidth ($I'_{OC}$) 302 occupies one least significant bit (LSB).

One type of interference is referred to here as "uplink re-use interference" or "internal co-channel interference." In the example shown in FIG. 2, the controller 202 and the radio points 204 are configured to enable multiple UEs 102 within the cell to transmit at the same time using the same frequency, as prescribed in the LTE wireless standard as frequency reuse=1. Uplink re-use interference (also referred to here is internal co-channel interference) is interference that a base station 104 experiences from transmissions on the same uplink frequency by other UEs 102 connected to the same cell.

Another type of interference is referred to here as "macro re-use interference" or "external co-channel interference." This type of interference is interference that a base station 104 experiences that results from transmissions on the same frequency by other UEs 102 connected to a different cell (for example, one provided by a different macro or small cell base station)

In the example shown in FIG. 3, the digital set point 304 can be derived by characterizing the performance of the receive signal path 112 for the LTE Physical Uplink Shared Channel (PUSCH), Physical Uplink Control Channel (PUCCH), and Random Access Channel (RACH) channels for a maximum signal-to-noise ratio (SNR) of 25 decibels (dB) 306 specified for 64-QAM modulation decoding. In this example, the digital set point 304 for the receive signal path 112 of the RF front-end circuit 108 is −32 dBFs.

In the example shown in FIG. 3, the analog set point 308 for the receive signal path 112 of the RF front-end circuit 108 is −12 dBFs, which is the maximum total average power required for preventing saturation of the ADC 120 from an uplink LTE signal with a typical peak-to-average-power-ratio (PAPR). The AGC function 116 for the receive signal path 112 is configured to maintain the total signal power (that is, signal plus noise and interference) at the input of the ADC 120 at the analog set point 308.

As noted above, an issue can arise with the AGC function 116 provided in the receive signal path 112 of the RF front-end circuit 108 when a sub-frame having a high resource block occupancy immediately follows a sub-frame having a low resource block occupancy. During the low-RB occupancy sub-frame, a very low time-domain average power will be measured by the AGC function 116, which results in the AGC function 116 applying a high gain to the receive signal path 112. As noted above, this is done in order to boost the power of the amplified signal presented as the input to the ADC 120. The latency that exists in the AGC function 116 between when the low power is measured and the application of the high gain to the receive signal path 112, can result in the maximum gain for the AGC function 116 being applied to the high-RB occupancy sub-frame. However, applying the maximum gain to a high-RB occupancy sub-frame can cause the amplified signal presented as the input to the ADC 120 to saturate the ADC 120.

One way to address this is to simply apply a reduced fixed maximum gain to the AGC function 116.

In a noise-limited case and assuming a noise figure (NF) of 10 dB and that thermal noise power in the 20 Mhz LTE band is −102 dBm, there is a noise floor ($I_{NF}$) of −92 dBm/20 MHz. At this level, for a signal-to-interference-plus-noise ratio (SINR) of 25 dB (required for 64-QAM decoding), the total mean received level ($I_{or}$) becomes −67 dBm/20 MHz (−92 dB+25 dB=−67 dBm/20 MHz). For this total mean received level ($I_{or}$), a fixed maximum gain of 41 dB is required for the AGC function 116 to cause the digital signals supplied as an input for digital signal processing to reach the required digital set point of −32 dBFs. At higher total mean received levels ($I_{or}$), in the case of interference-limited scenarios, the fixed maximum gain required for the AGC function 116 would be less than 41 dB.

With the maximum gain for the AGC function 116 restricted to 41 dB, a headroom of 20 dB is ensured between the digital set point and the analog set point. This headroom of 20 dB can be used to accommodate: (i) a rise in the co-channel uplink reuse interference level and/or macro UE interference in the operating LTE bandwidth; (ii) signal fading due to imperfections in uplink power control; (iii) temporary power racing between UEs 102 using the same frequency; and (iv) a LTE Sounding Reference Signal (SRS) power rise of up to 20 dB in the SRS-only case.

With this fixed maximum gain approach, the maximum gain setting for the AGC function 116 is not dynamically changed. Instead, the fixed maximum gain setting is pre-programmed into the maximum gain setting 122.

With this fixed maximum gain approach, there is no risk of saturation over a 20 dB rise-over-thermal (RoT) dynamic range of co-channel interference, as well as the interference requirements specified in the dynamic range sections of 3GPP LTE Technical Specification (TS) 36.141 regarding base station conformance testing. Also, debugging this approach is easier (and can be done with more flexibility) since the fixed maximum gain changes are localized at one place in the RF front-end circuit 108.

While the fixed reduced maximum gain approach is suitable for some deployment cases, satisfactory performance is limited to co-channel interference levels of up to −71 dBm/20 MHz. That is, the 25 dB SINR requirement (for 64-QAM modulation decoding) for LTE burst traffic cases (that is, where high-RB occupancy subframes follow low-RB occupancy subframes) is only met in the presence of a maximum uplink re-use interference level and/or macro UE interference level of up to only −71 dBm/20 MHz. Also, a risk of saturation does exist for SRS-only sub-frames (which require 20 dB SINR) in the presence of a maximum uplink reuse interference and/or macro interference level beyond −71 dBm/20 Mhz.

Moreover, in the (less likely) event that the digital set point of −32 dBFs has to be increased to provide more bits of I and Q data to achieve desired channel performance, the maximum uplink reuse interference and/or macro interference level (−71 dBm/20 Mhz in the previously mentioned examples) will be reduced proportionally.

Instead of using a reduced, fixed maximum gain, in the exemplary embodiment shown in FIG. 1, the base station 104 includes a gain control function 124 that is configured to dynamically reprogram the maximum gain of the AGC function 116. The gain control function 124 dynamically reprograms the maximum gain of the AGC function 116 to maintain the digital data used as an input for the digital signal processing performed in the baseband modem 110 at the digital set point.

The gain control function 124 can be implemented as software executing on a controller or other processor included in the base station 104.

Figure 4:
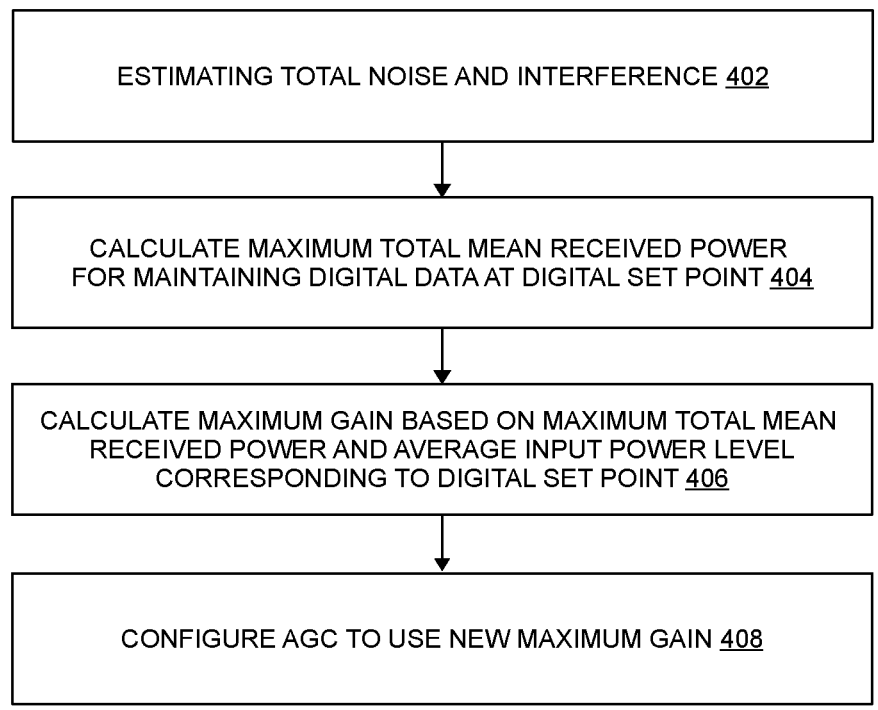
FIG. 4 is a flow diagram of one exemplary embodiment of a method of dynamically reprogramming the maximum gain of an automatic gain control function for the receive signal path of a receiver using a long-term estimate of the total noise and interference power.

FIG. 4 is a flow diagram of one exemplary embodiment of a method 400 of dynamically reprogramming the maximum gain of an automatic gain control function for the receive signal path of a receiver using a long-term estimate of the total noise and interference power in the relevant LTE bandwidth. The exemplary embodiment of method 400 shown in FIG. 4 is described here as being implemented using the system 100 shown in FIG. 1 and in connection with the budget for the LTE example described above in connection with FIG. 3.

The blocks of the flow diagram shown in FIG. 4 have been arranged in a generally sequential manner for ease of explanation; however, it is to be understood that this arrangement is merely exemplary, and it should be recognized that the processing associated with method 400 (and the blocks shown in FIG. 4) can occur in a different order (for example, where at least some of the processing associated with the blocks is performed in parallel and/or in an event-driven manner).

The processing associated with method 400 is repeatedly performed (for example, once for each of successive measurement periods).

Method 400 comprises estimating the total noise and interference power in the relevant LTE bandwidth for the receive signal path 112 (block 402). The total noise and interference power in the relevant LTE bandwidth ($I'_{OC}$) is defined, in this exemplary embodiment, as follows:

$$I'_{OC} = I_{NF} + I_{OC} + I_{OCC}$$

where:

$I_{NF}$ is the noise floor of the receive signal path 112 in the relevant LTE bandwidth;

$I_{OC}$ is the external co-channel interference in the relevant LTE bandwidth for the receive signal path 112; and $I_{OCC}$ is the internal co-channel interference in the relevant LTE bandwidth for the receive signal path 112.

In this exemplary embodiment, the total noise and interference power estimates are determined by the gain control function 124 based on measurements made by the baseband modem 110 as a part of the digital signal processing it performs.

For each measurement period, the noise floor ($I_{NF}$), the external co-channel interference, and the internal co-channel interference are estimated. The total noise and interference power ($I'_{OC}$) in the relevant LTE bandwidth for the receive signal path 112 is calculated for each measurement period, and a final total noise and interference power estimate ($I'_{OC}$) can then be calculated using a smoothing function (for example, using a moving average). In one example, the initial estimate of the total noise and interference power ($I'_{OC}$) in the relevant LTE bandwidth for the receive signal path 112 is calculated using a long-term average made over 80 seconds.

Method 400 further comprises calculating the maximum total mean received power ($I_{Or}$) in the receive signal path 112 for maintaining the digital data used as an input for the digital signal processing performed in the baseband modem 110 at the digital set point (block 404).

The maximum total mean received power ($I_{Or}$) in the receive signal path 112 is calculated based on the maximum required SINR for the wireless signal to be received when all wireless resources are allocated. In the LTE example described above in connection with FIG. 3, the maximum required SINR for the wireless signal is 25 dB (for 64-QAM modulation decoding and when all physical resource blocks (PRBs) are allocated). In other words, the maximum total mean received level ($I_{Or}$) required needs to be 25 dB above the long-term total noise and interference estimate ($I'_{OC}$):

$$I'_{Or} = I'_{OC} + 25 \text{ dB}$$

In this exemplary embodiment, the gain control function 124 calculates the maximum total mean received power ($I_{Or}$):

Method 400 further comprises calculating the maximum gain to be used by the AGC function 116 in the receive signal path 112 based on the maximum total mean received power ($I_{Or}$) in the receive signal path 112 and the average input power level ($I_O$) at the input of the ADC 120 that corresponds to the digital set point (block 406).

The maximum gain for the AGC function 116 in the receive signal path 112 required to amplify the maximum total mean received power ($I_{Or}$) to an average input power level ($I_O$) at the ADC 120 input that corresponds to the digital set point is calculated as follows:

$$G = I_O - I_{Or}$$

where G is the maximum gain (in dB).

In this exemplary embodiment, the gain control function 124 calculates the maximum gain (G).

Method 400 further comprises configuring the AGC function 116 to use the newly calculated maximum gain (G) for the receive signal path 112 (block 408). As noted above, the AGC function 116 dynamically adjusts the receive-path gain to attempt to have the resulting amplified signal presented as an input to the ADC 120 be at the analog set point. However, the AGC function 116 is restricted in the amount of gain that it can apply to the receive signal path 112 by the maximum gain (G) for which it is configured. This can be shown in the following equation:

$$G_{applied} = \min(G, G_{analog})$$

where:

$G_{applied}$ is the amount of gain applied by the AGC function 116;

G is the maximum gain for the digital set point noted above; and $G_{analog}$ is the maximum gain for the analog set point computed by the AGC function 116.

In this exemplary embodiment, the AGC function 116 is configured to use the newly calculated maximum gain (G) for the receive signal path 112 by writing the newly calculated maximum gain (G) to the maximum gain register 122. In this exemplary embodiment, the gain control function 124 causes the newly calculated maximum gain (G) to be written to the maximum gain register 122.

In other embodiments, the AGC function 116 is configured to use the newly calculated maximum gain (G) for the receive signal path 112 in other ways.

The newly calculated maximum gain (G) can be updated at a slow rate (with a relatively long measurement period for the noise and interference power estimates of block 402). In one implementation, this rate is configurable and the length of the period is on the order of seconds or slower.

Restricting the maximum gain (G) to one that corresponds to the digital set point (−32 dBFs in the example shown in FIG. 3) enables enough headroom between the digital set point and the analog set point (20 dB in the example shown in FIG. 3) that can be used to accommodate: (i) a high-RB occupancy sub-frame immediately following a low-RB occupancy sub-frame; (ii) a temporary rise in internal and external co-channel interference due to the uplink power control applied by the UE and base station; (iii) signal fading resulting from imperfections in such uplink power control; (iv) temporary power racing between UEs 102 connected to the same cell that are using the same frequency; and (v) a LTE Sounding Reference Signal (SRS) power rise of up to 20 dB in the SRS-only case.

Table 1 lists one example of the maximum gain (G) required for various total noise and interference power levels ($I'_{OC}$). The total noise and interference power levels ($I'_{OC}$) correspond to a noise figure of 10 dB for the receive signal path 112 and the various interference levels specified in 3GPP LTE TS 36.141 regarding base station conformance.

TABLE 1

| Total Noise and Interference Power $I'_{OC}$ (dBm) | Maximum Total Mean Received Level $I_{Or}$ (dBm) | Average Input Power Level For Digital Set Point $I_0$ (dBm) | Maximum Gain G (dB) |
|---|---|---|---|
| −92 | −67 | −26 | 41 |
| −87 | −62 | −26 | 36 |
| −82 | −57 | −26 | 31 |
| −77 | −52 | −26 | 26 |
| −72 | −47 | −26 | 21 |
| −67 | −42 | −26 | 16 |
| −62 | −37 | −26 | 11 |
| −57 | −32 | −26 | 6 |
| −52 | −27 | −26 | 1 |

The first row of Table 1 indicates that a maximum gain (G) of 41 dB is calculated in the noise-limited case. That is, as described above in connection block 404, the maximum total mean received level ($I_{Or}$) (the second column shown in Table 1) is calculated by adding the total noise and interference power level ($I'_{OC}$) (the value of −92 dBm shown in the first column of Table 1) to the maximum required SINR for the wireless signal, which is 25 dB in this LTE example for 64-QAM modulation decoding and when all physical resource blocks (PRBs) are allocated for a 20 MHz LTE bandwidth.

Then, as described above in connection with block 406, the resulting maximum total mean received level ($I_{Or}$) (−67 dBm in this example) is subtracted from the average input power level ($I_0$) at the ADC 120 input that corresponds to the digital set point, which is shown in the third column of Table 1 and is −26 dBm in this example. (That is, −26 dBm−(−67 dBm)=41 dB.) This results in a maximum required gain (G) of 41 dB in the noise-limited case.

Likewise, the seventh row of Table 1 indicates that a maximum gain (G) of 11 dB is calculated in the interference-limited case of Additive White Gaussian Noise (AWGN) interference at −62 dBm/20 Mhz derived from the Dynamic Range LTE conformance specifications in 3GPP LTE TS 36.141 regarding base station conformance.

Where method 400 is used with base stations 104 that are implemented using a point-to-multipoint distributed base station architecture as shown in FIG. 2, the interference measurements likely would only be available in the central controller 202, in which case at least a portion of the gain control function 124 would be implemented in the central controller 202. This may impose some limits on the scalability of the processing associated with method 400 if the system is implemented as shown in FIG. 2.

Figure 5:
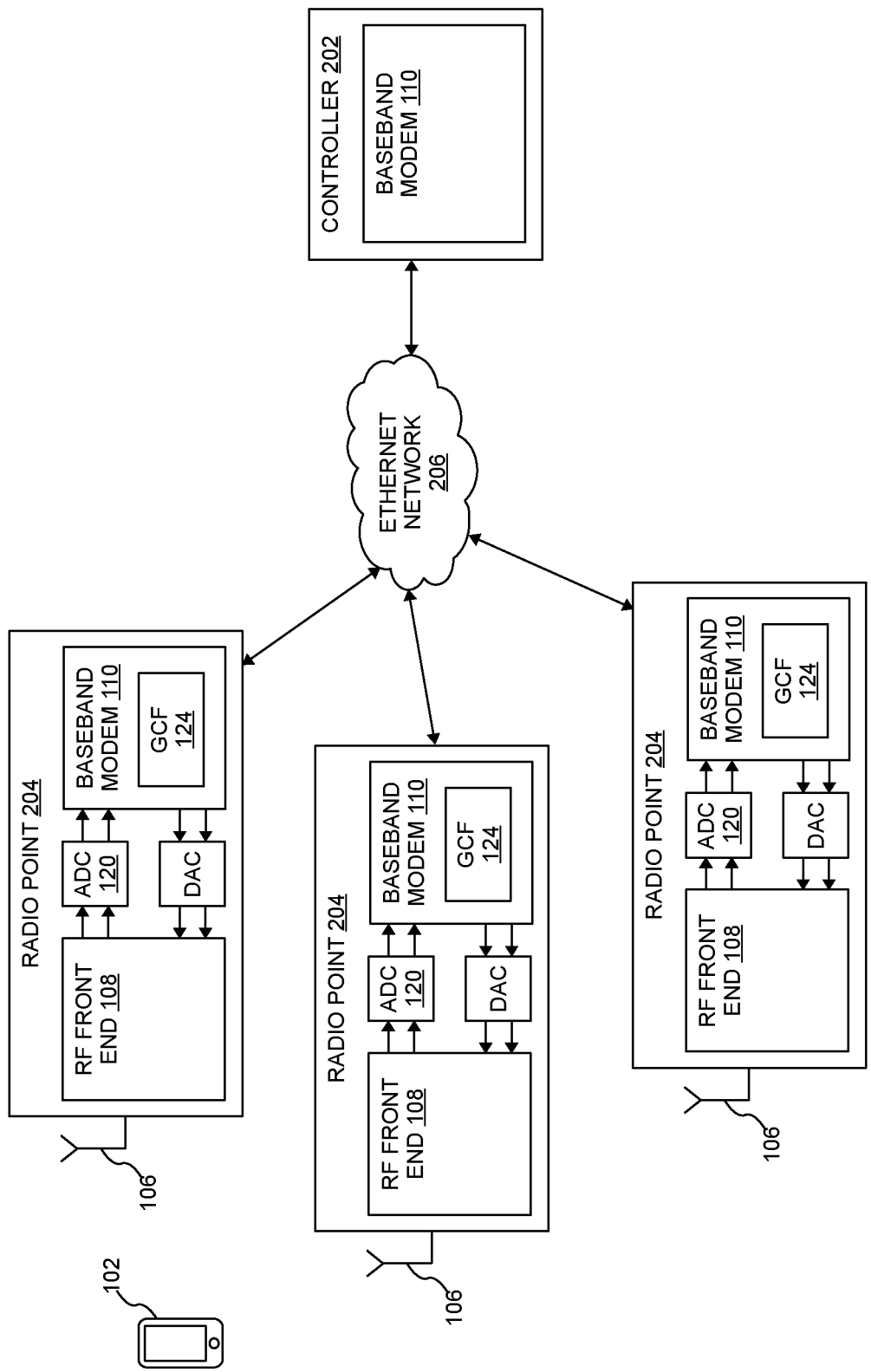
FIG. 5 is a block diagram of one exemplary embodiment of a distributed point-to-multipoint base system.

Another approach to dynamically reprogramming the maximum gain used by the AGC function 116 is based on a received signal strength (for example, a received signal strength indication (RSSI)) measurement for the received signal made in the RF front-end circuit 108. The advantage of this approach is that the associated processing can be implemented in the node that contains the RF front-end circuit 108. For example, in the example shown in FIG. 2, the processing associated with this approach can be implemented entirely in the remotely-located radio points 204, which is more scalable than an approach that requires some processing to be performed in the central controller 202. This is illustrated in FIG. 5.

Figure 6:
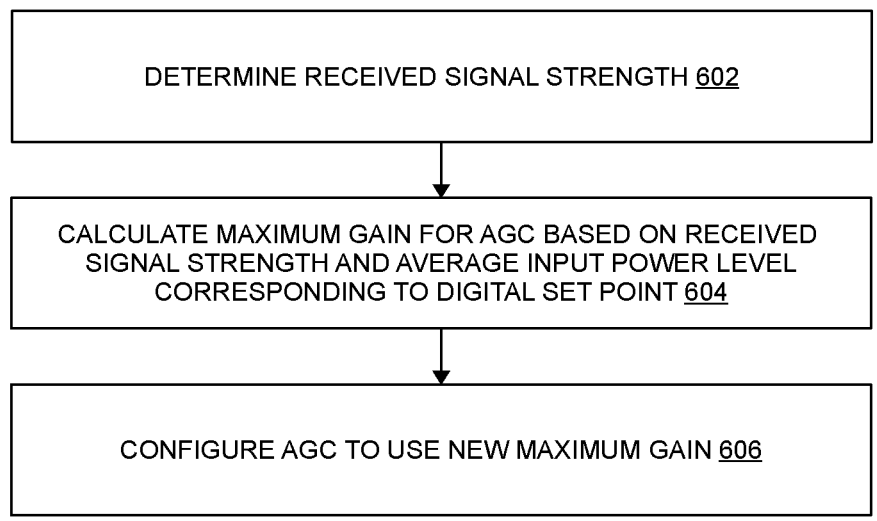
FIG. 6 is a flow diagram of one exemplary embodiment of a method of dynamically reprogramming the maximum gain of an automatic gain control function for the receive signal path of a receiver using a received signal strength for the received signal.

FIG. 6 is a flow diagram of one exemplary embodiment of a method 600 of dynamically reprogramming the maximum gain of an automatic gain control function for the receive signal path of a base station receiver using a received signal strength for the received signal. The exemplary embodiment of method 600 shown in FIG. 6 is described here as being implemented using the system 100 shown in FIGS. 1 and 5 and in connection with the budget for the LTE example described above in connection with FIG. 3.

The blocks of the flow diagram shown in FIG. 6 have been arranged in a generally sequential manner for ease of explanation; however, it is to be understood that this arrangement is merely exemplary, and it should be recognized that the processing associated with method 600 (and the blocks shown in FIG. 6) can occur in a different order (for example, where at least some of the processing associated with the blocks is performed in parallel and/or in an event-driven manner).

The processing associated with method 600 is repeatedly performed (for example, once for each of successive measurement periods).

Method 600 comprises determining the received signal strength of the signal received at receive signal path of the RF front-end circuit 108 (block 602.) In one example, this is done by making several received signal strength measurements and calculating the received signal strength of the signal received at the receive signal path as a function of the received signal strength measurements (for example, by averaging the received signal strength measurements).

In this exemplary embodiment, the RF front-end circuit 108 includes a power detector (not shown) that is coupled to the receive signal path 112 and that is used to make received signal strength indictor (RSSI) measurements for the received signal.

For each measurement period, several RSSI measurements of the received signal in the relevant LTE bandwidth are made periodically over the course of that measurement period. For each measurement period, the various RSSI measurements are averaged using a smoothing function (such as a moving average).

In this exemplary embodiment, the gain control function 124 in the radio-point baseband modem 110 interacts with the relevant power detector in the RF front-end circuit 108 to make the received signal strength measurements and calculate long-term average of the receive signal strength.

Method 600 further comprises calculating the maximum gain to be used by the AGC function 116 in the receive signal path 112 based on the average received signal strength for the received signal and the average input power level ($I_0$) at the input of the ADC 120 that corresponds to the digital set point (block 604).

The maximum gain for the AGC function 116 in the receive signal path 112 required to amplify a received signal having the power level associated with the average RSSI to an average input power level ($I_0$) at the ADC 120 input that corresponds to the digital set point is calculated as follows:

$$G = I_0 - \text{RSSI}$$

where G is the maximum gain (in dB).

In this exemplary embodiment, the gain control function 124 calculates the maximum gain (G).

Method 600 further comprises configuring the AGC function 116 to use the newly calculated maximum gain (G) for the receive signal path 112 (block 606). As noted above, the AGC function 116 dynamically adjusts the receive-path gain to attempt to have the resulting amplified signal presented as an input to the ADC 120 be at the analog set point. However, the AGC function 116 is restricted in the amount of gain that it can apply to the receive signal path 112 by the maximum gain (G) for which it is configured. This can be shown in the following equation:

$$G_{applied} = \min(41 \text{ dB}, G, G_{analog})$$

where:

$G_{applied}$ is the amount of gain applied by the AGC function 116;

41 dB is the $_{maximum}$ gain required in the example described below;

G is the $_{maximum}$ gain for the digital set point noted above; and $G_{analog}$ is the maximum gain for the analog set point computed by the AGC function 116.

In this exemplary embodiment, the AGC function 116 is configured to use the newly calculated maximum gain (G) for the receive signal path 112 by writing the newly calculated maximum gain (G) to the maximum gain register 122. In this exemplary embodiment, the gain control function 124 causes the newly calculated maximum gain (G) to be written to the maximum gain register 122.

In other embodiments, the AGC function 116 is configured to use the newly calculated maximum gain (G) for the receive signal path 112 in other ways.

Method 600 can be seen as an extension of the fixed maximum gain approach described above.

As noted above, in a noise-limited case and assuming a noise figure (NF) of 10 dB and that thermal noise power in the 20 Mhz LTE band is −102 dBm, there is a noise floor ($I_{NF}$) of −92 dBm/20 MHz. At this level, for an SINR of 25 dB (required for 64-QAM decoding), the total mean received level ($I_{or}$) is −92 dB. (−92 dB+25 dB=−67 dBm/20 MHz). For this total mean received level ($I_{or}$) a fixed maximum gain of 41 dB is required for the AGC control function 116 to cause the digital data supplied as an input for digital signal processing to reach the required digital set point of −32 dBFs.

This maximum gain value (G) of +41 dB can be used as the maximum gain value (G) for the RSSI-based approach of method 600. This maximum gain value (G) is satisfactory for RSSI levels of up to −67 dBm. At a RSSI level higher than −67 dBm, the maximum gain value (G) will be reduced to amplify the RSSI level to maintain the resulting digital data supplied to the baseband modem 110 at the digital set point (which is −32 dBFs or −26 dBm in this example).

Thus, in the example illustrated in FIG. 3, method 600 supports the desired SINR 25 dB performance for levels of interference greater than −71 dBm/20 Mhz up to −52 dBm/20 Mhz (for a limit in register 122 of 1 dB max gain, for example) unlike with the fixed approach described above.

However, when the maximum gain (G) is set to the maximum gain value (G) of +41 dB, burst traffic in the presence of interference levels beyond −71 dBm/20 Mhz will initially result in saturation of the ADC 120 for high SINRs on high-RB occupancy sub-frames following low-RB occupancy sub-frames due to the operation of the AGC function 116 as described above. This issue will exist until method 600 is able to calculate a new maximum gain value and configure the AGC function 116 to use the new maximum gain value. Using measurement periods that have the same length as those used in method 400, however, would likely result in radio link failures. To avoid this, with method 600, a much shorter measurement period can be used. For example, a measurement period that is 5 radio frames long (that is, 50 milliseconds (ms)) can be used.

Where the uplink power control in the baseband modem 110 reacts to block error based on average SINR measurements computed over periods of, for example, 300 milliseconds, a measurement period for the average RSSI calculation of 50 ms is typically sufficient to avoid a major impact on system throughput due to transient block errors while a new maximum gain value is being calculated.

Again, unlike with the fixed maximum gain approach described above, the RSSI-based approach of method 600 works beyond −71 dBm/20 Mhz co-channel interference in all cases of full traffic and burst traffic by using the long-term average RSSI measurement to continuously compute the maximum gain required to maintain the resulting digital data supplied to the baseband modem 110 at the digital set point.

As with method 400, using the RSSI-approach of method 600 to restrict the maximum gain (G) to one that corresponds to the digital set point (−32 dBFs in the example shown in FIG. 3) enables enough headroom between the digital set point and the analog set point (20 dB in the example shown in FIG. 3) that can be used to accommodate: (i) a high-RB occupancy sub-frame immediately following a low-RB occupancy sub-frame; (ii) a temporary rise in internal and external co-channel interference due to uplink power control applied by the UE and base stations; (iii) signal fading envelope resulting from imperfections in such uplink power control; (iv) temporary power racing between UEs 102 connected to the same cell that are using the same frequency; and (v) an LTE SRS power rise of up to 20 dB in the SRS-only case.

As noted above, another advantage of the RSSI-approach of method 600 is that the associated processing can be implemented in the node that contains the baseband modem 110. For example, where this approach is used with base stations 104 that are implemented as shown in FIG. 5, the processing associated with this approach can be implemented entirely in the remotely-located radio points 204, which is more scalable than approaches that require some processing to be performed in the central controller 202.

Table 2 lists the maximum gain (G) required for various long-term average RSSI measurements. The maximum gain G is shown in the fourth column of Table 2.

The first column of Table 2 lists the expected long-term average RSSI measurements for various noise and interference power levels (shown in the second column of Table 2) when the required SINR for the wireless signal, which is 25 dB in this LTE example for 64-QAM modulation decoding and when all PRBs are allocated. The various total noise and interference power levels, for a 20 MHz LTE bandwidth, correspond to a noise figure of 10 dB for the receive signal path 112 and the various interference levels specified in 3GPP LTE TS 36.141 regarding base station conformance.

The third column of Table 2 includes the average input power level ($I_0$) at the ADC 120 input that corresponds to the digital set point, which is −26 dBm (that is, −32 dBFS) in this example.

TABLE 2

| RSSI (dBm) | Total Noise and Interference Power I'$_{OC}$ (dBm) | Average Input Power level for Digital Set Point I$_0$ (dBm) | Maximum Gain G (dB) |
|---|---|---|---|
| −67 | −92 | −26 | 41 |
| −62 | −87 | −26 | 36 |
| −57 | −82 | −26 | 31 |
| −52 | −77 | −26 | 26 |
| −47 | −72 | −26 | 21 |
| −42 | −67 | −26 | 16 |
| −37 | −62 | −26 | 11 |
| −32 | −57 | −26 | 6 |
| −27 | −52 | −26 | 1 |

As with Table 1, the first row of Table 2 indicates that a maximum gain (G) of 41 dB is calculated in the noise-limited case. That is, as described above in connection block 404, the maximum gain value (G) (the fourth column shown in Table 2) is calculated by subtracting the long-term average RSSI measurement shown in the first column (−67 dBm) from the average input power level (I$_0$) at the ADC 120 input that corresponds to the digital set point, which is −26 dBm in this example. That is, −26 dBm−(−67 dBm)=41 dB. This results in a maximum required gain (G) of 41 dB in the noise-limited case.

Although the processing associated with methods 400 and 600 have been described in the context of a RF front-end circuit 108 that includes an AGC function 116, it is to be understood that methods 400 and 600 can be adapted for use with other gain control schemes. In one such other gain control scheme, for example a manual gain control (MGC) scheme, the gain that is applied to the receive signal path 112 is manually set (for example, by writing a gain value to an appropriate register). Methods 400 and 600 can be used to determine the fixed gain that is applied to the receive signal path 112 by using methods 400 and 600 to recalculate a fixed manual gain instead of a maximum gain value.

As noted above, the gain control techniques described here can be used with any base station architecture (for example, point-to-multipoint distributed architectures of the type shown in FIGS. 2 and 5, monolithic architectures (used with, for example, small cell and macro base stations), and point-to-point distributed architectures (for example, where a single baseband unit (BBU) communicates with a single remote radio head (RRH) using a Common Public Radio Interface (CPRI) or other front-haul interface). The gain control techniques described here can also be used with repeater, distributed antenna systems (DASs), and DAS-like systems.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

EXAMPLE EMBODIMENTS

Example 1 includes a method of controlling a gain for a receive signal path for receiving a signal communicated over a wireless channel, wherein an input to an analog-to-digital converter (ADC) is generated in the receive signal path, the ADC outputting digital data used for digital signal processing, the method comprising: repeatedly performing the following: determining an estimate of the total noise and interference in a signal received using the receive signal path; determining a gain value for the receive signal path based on the estimate of the total noise and interference in order to maintain the digital data at a digital set point for a signal-to-interference-plus-noise-ratio (SINR) decoded with a highest modulation and coding scheme (MCS) specified for the wireless channel; and causing the receive signal path to use the gain value as the gain for the receive signal path.

Example 2 includes the method of Example 1, wherein the receive signal path comprises an automatic gain control (AGC) function, wherein the gain value comprises a maximum gain value that is applied to the automatic gain control function.

Example 3 includes the method of any of the Examples 1-2, wherein the receive signal path is configured to apply a fixed gain, wherein the gain value comprises a gain value to be used as the fixed gain for the receive signal path.

Example 4 includes the method of any of the Examples 1-3, wherein the signal is communicated over the wireless channel using a Long Term Evolution (LTE) air interface.

Example 5 includes the method of any of the Examples 1-4, wherein the estimate of the total noise and interference in the signal received using the receive signal path reflects the total noise and interference in the signal received using the receive signal path over a measurement period.

Example 6 includes the method of any of the Examples 1-5, wherein determining the estimate of the total noise and interference in the signal received using the receive signal path comprises: adding together an estimate of a noise floor for the receive signal path, an estimate of external co-channel interference, and an estimate of internal co-channel interference.

Example 7 includes the method of any of the Examples 1-6, wherein determining the gain value for the receive signal path based on the estimate of the total noise and interference in order to maintain the digital data at the digital set point for the SINR decoded with the highest MCS specified for the wireless channel comprises: calculating a maximum total mean received power in the receive signal path to maintain the digital data at the digital set point; and calculating the gain value for receive signal path based on the maximum total mean received power in the receive signal path and an average input power level at the input of the ADC that corresponds to the digital set point.

Example 8 includes the method of Example 7, wherein calculating the maximum total mean received power in the receive signal path to maintain the digital data at the digital set point comprises: adding the estimate of the total noise and interference to a maximum required SINK for the wireless signal when all wireless resources are allocated.

Example 9 includes the method of any of the Examples 1-8, wherein causing the receive signal path to use the gain value as the gain for the receive signal path comprises: writing the gain value to a gain register associated with the receive signal path.

Example 10 includes a method of controlling a gain for a receive signal path for receiving a signal communicated over a wireless channel, wherein an input to an analog-to-digital converter (ADC) is generated in the receive signal path, the ADC outputting digital data used for digital signal processing, the method comprising: repeatedly performing the following: determining a received signal strength of the signal received at the receive signal path; determining a gain value for the receive signal path based on the received signal strength that maintains the digital data at a digital set point for a signal-to-interference-plus-noise-ratio (SINR) sufficient to decode the modulation and coding scheme (MCS) specified for the wireless channel; and causing the receive signal path to use the gain value as the gain for the receive signal path.

Example 11 includes the method of Example 10, wherein the receive signal path comprises an automatic gain control (AGC) function, wherein the gain value comprises a maximum gain value that is applied to the automatic gain control function.

Example 12 includes the method of any of the Examples 10-11, wherein the receive signal path is configured to apply a fixed gain, wherein the gain value comprises a gain value to be used as the fixed gain for the receive signal path.

Example 13 includes the method of any of the Examples 10-12, wherein the signal is communicated over the wireless channel using a Long Term Evolution (LTE) air interface.

Example 14 includes the method of any of the Examples 10-13, wherein determining the received signal strength of the signal received at receive signal path comprises making several received signal strength measurements and calculating the received signal strength of the signal received at the receive signal path as a function of the received signal strength measurements.

Example 15 includes the method of any of the Examples 10-14, wherein determining the gain value for the receive signal path based on the received signal strength that maintains the digital data at the digital set point comprises: calculating the gain value for receive signal path based on the received signal strength and an average input power level at the input of the ADC that corresponds to the digital set point.

Example 16 includes the method of any of the Examples 10-15, wherein causing the receive signal path to use the gain value as the gain for the receive signal path comprises: writing the gain value to a gain register associated with the receive signal path.

Example 17 includes a wireless system comprising: a radio frequency (RF) front end circuit comprising a receive signal path to receive a signal communicated over a wireless channel; an analog-to-digital converter (ADC), wherein an input to the ADC is generated in the receive signal path; a baseband modem to perform digital signal processing, wherein the ADC outputs digital data used for the digital signal processing; wherein the wireless system is configured to repeatedly perform the following: determine an estimate of the total noise and interference in the signal received using the receive signal path; determine a gain value for the receive signal path based on the estimate of the total noise and interference in order to maintain the digital data at a digital set point for a signal-to-interference-plus-noise-ratio (SINK) decoded with a highest modulation and coding scheme (MCS) specified for the wireless channel; and cause the receive signal path to use the gain value as the gain for the receive signal path.

Example 18 includes the wireless system of Example 17, wherein the base station system comprises a point-to-multipoint architecture comprising at least one central controller and a plurality of radio points, wherein the central controller is communicatively coupled to the plurality of radio points.

Example 19 includes the wireless system of Example 18, wherein the baseband modem is implemented at least in part in the controller and at least in part in the radio points.

Example 20 includes the wireless system of any of the Examples 17-19, wherein the wireless system comprises at least one of a small cell base station, a macro base station, a distributed antenna system (DAS), and a point-to-point architecture comprising a baseband unit (BBU) and a remote radio head (RRH).

Example 21 includes the wireless system of any of the Examples 17-20, wherein the receive signal path comprises an automatic gain control (AGC) function, wherein the gain value comprises a maximum gain value that is applied to the automatic gain control function.

Example 22 includes the wireless system of any of the Examples 17-21, wherein the receive signal path is configured to apply a fixed gain, wherein the gain value comprises a gain value to be used as the fixed gain for the receive signal path.

Example 23 includes the wireless system of any of the Examples 17-22, wherein the wireless system is configured to communicate over the wireless channel using a Long Term Evolution (LTE) air interface.

Example 24 includes the wireless system of any of the Examples 17-23, wherein the estimate of the total noise and interference in the signal received using the receive signal path reflects the total noise and interference in the signal received using the receive signal path over a measurement period.

Example 25 includes the wireless system of any of the Examples 17-24, wherein the wireless system is configured to determine the estimate of the total noise and interference in the signal received using the receive signal path by: adding together an estimate of a noise floor for the receive signal path, an estimate of external co-channel interference, and an estimate of internal co-channel interference.

Example 26 includes the wireless system of any of the Examples 17-25, wherein the wireless system is configured to determine the gain value for the receive signal path based on each estimate of the total noise and interference in order to maintain the digital data at the digital set point for the SINR decoded with the highest MCS specified for the wireless channel by: calculating a maximum total mean received power in the receive signal path to maintain the digital data at the digital set point; and calculating the gain value for receive signal path based on the maximum total mean received power in the receive signal path and an average input power level at the input of the ADC that corresponds to the digital set point.

Example 27 includes the wireless system of Example 26, wherein the wireless system is configured to calculate the maximum total mean received power in the receive signal path to maintain the digital data at the digital set point by: adding the estimate of the total noise and interference to a maximum required signal-to-interference-plus-noise ratio (SINK) for the wireless signal when all wireless resources are allocated.

Example 28 includes the wireless system of any of the Examples 17-27, wherein the wireless system is configured to cause the receive signal path to use the gain value as the gain for the receive signal path by: writing the gain value to a gain register associated with the receive signal path.

Example 29 includes a wireless system comprising: a radio frequency (RF) front end circuit comprising a receive signal path to receive a signal communicated over a wireless channel; an analog-to-digital converter (ADC), wherein an input to the ADC is generated in the receive signal path; a baseband modem to perform digital signal processing, wherein the ADC outputs digital data used for the digital signal processing; wherein the wireless system is configured to repeatedly perform the following: determine a received signal strength of the signal received at the receive signal path; determine a gain value for the receive signal path based on the received signal strength that maintains the digital data at a digital set point for a signal-to-interference-plus-noise-ratio (SINR) sufficient to decode the modulation and coding scheme (MCS) specified for the wireless channel; and cause the receive signal path to use the gain value as the gain for the receive signal path.

Example 30 includes the wireless system of Example 29, wherein the base station system comprises a point-to-multipoint architecture comprising at least one central controller and a plurality of radio points, wherein the central controller is communicatively coupled to the plurality of radio points.

Example 31 includes the wireless system of any of the Examples 29-30, wherein the baseband modem is implemented at least in part in the controller and at least in part in the radio points.

Example 32 includes the wireless system of any of the Examples 29-31, wherein the wireless system comprises at least one of a small cell base station, a macro base station, a distributed antenna system (DAS), and a point-to-point architecture comprising a baseband unit (BBU) and a remote radio head (RRH).

Example 33 includes the wireless system of any of the Examples 29-32, wherein the receive signal path comprises an automatic gain control (AGC) function, wherein the gain value comprises a maximum gain value that is applied to the automatic gain control function.

Example 34 includes the wireless system of any of the Examples 29-33, wherein the receive signal path is configured to apply a fixed gain, wherein the gain value comprises a gain value to be used as the fixed gain for the receive signal path.

Example 35 includes the wireless system of any of the Examples 29-34, wherein the wireless system is configured to communicate over the wireless channel using a Long Term Evolution (LTE) air interface.

Example 36 includes the wireless system of any of the Examples 29-35, wherein the wireless system is configured to determine the received signal strength of the signal received at receive signal path by: making several received signal strength measurements and calculating the received signal strength of the signal received at the receive signal path as a function of the received signal strength measurements.

Example 37 includes the wireless system of any of the Examples 29-36, wherein the wireless system is configured to determine the gain value for the receive signal path based on the received signal strength that maintains the digital data at the digital set point by: calculating the gain value for receive signal path based on the received signal strength and an average input power level at the input of the ADC that corresponds to the digital set point.

Example 38 includes the wireless system of any of the Examples 29-37, wherein the wireless system is configured to cause the receive signal path to use the gain value as the gain for the receive signal path by: writing the gain value to a gain register associated with the receive signal path.

Example 39 includes a scalable wireless system comprising: a controller configured to communicate with a core network, the controller comprising a controller baseband modem; a plurality of radio points communicatively coupled to the controller, each of the plurality of radio points comprising: a respective radio frequency (RF) front end circuit comprising a respective receive signal path to receive a signal communicated over a wireless channel; a respective analog-to-digital converter (ADC), wherein a respective input to the respective ADC is generated in the receive signal path; a respective radio-point baseband modem to perform digital signal processing, wherein the respective ADC outputs respective digital data used for the digital signal processing; wherein the radio-point baseband modem is configured to: autonomously determine, without involvement of controller baseband modem, a gain value for the receive signal path based on a received signal strength that maintains the digital data at a digital set point for a signal-to-interference-plus-noise-ratio (SINR) sufficient to decode the modulation and coding scheme (MCS) specified for the wireless channel; and cause the receive signal path to use the gain value as the gain for the receive signal path.

Example 40 includes the wireless system of Example 39, wherein the gain value is a maximum gain value for the receive signal path.

Example 41 includes a method of controlling a gain for a receive signal path for receiving a signal communicated over a wireless channel, wherein an input to an analog-to-digital converter (ADC) is generated in the receive signal path, the ADC outputting digital data used for digital signal processing, the method comprising: determining an estimate of the total noise and interference in a signal received using the receive signal path; and controlling the gain in the receive signal path, based on the estimate of the total noise and interference, in order to limit the gain so as to increase throughput in the wireless channel for burst traffic where high resource block occupancy subframes follow low resource block occupancy subframes.

Example 42 includes a wireless system comprising: a radio frequency (RF) front end circuit comprising a receive signal path to receive a signal communicated over a wireless channel; an analog-to-digital converter (ADC), wherein an input to the ADC is generated in the receive signal path; a baseband modem to perform digital signal processing, wherein the ADC outputs digital data used for the digital signal processing; wherein the wireless system is configured to: determine an estimate of the total noise and interference in the signal received using the receive signal path; and control the gain in the receive signal path, based on the estimate of the total noise and interference, in order to limit the gain so as to increase throughput in the wireless channel for burst traffic where high resource block occupancy subframes follow low resource block occupancy subframes.

Example 43 includes a method of controlling a gain for a receive signal path for receiving a signal communicated over a wireless channel, wherein an input to an analog-to-digital converter (ADC) is generated in the receive signal path, the ADC outputting digital data used for digital signal processing, the method comprising: determining a received signal strength of the signal received at the receive signal path; and controlling the gain in the receive signal path, based on the received signal strength, in order to limit the gain so as to increase throughput in the wireless channel for burst traffic where high resource block occupancy subframes follow low resource block occupancy subframes.

Example 44 includes a wireless system comprising: a radio frequency (RF) front end circuit comprising a receive signal path to receive a signal communicated over a wireless channel; an analog-to-digital converter (ADC), wherein an input to the ADC is generated in the receive signal path; a baseband modem to perform digital signal processing, wherein the ADC outputs digital data used for the digital signal processing; wherein the wireless system is configured to: determine a received signal strength of the signal received at the receive signal path; and control the gain in the receive signal path, based on the received signal strength, in order to limit the gain so as to increase throughput in the wireless channel for burst traffic where high resource block occupancy subframes follow low resource block occupancy subframes.

What is claimed is:

1. A method of controlling a gain for a receive signal path for receiving a signal communicated over a wireless channel, wherein an input to an analog-to-digital converter (ADC) is generated in the receive signal path, the ADC outputting digital data used for digital signal processing, the method comprising:
repeatedly performing the following:
determining an estimate of the total noise and interference in a signal received using the receive signal path;
determining a gain value for the receive signal path based on the estimate of the total noise and interference in order to maintain the digital data at a digital set point for a signal-to-interference-plus-noise-ratio (SINR) decoded with a highest modulation and coding scheme (MCS) specified for the wireless channel; and
causing the receive signal path to use the gain value as the gain for the receive signal path.

2. The method of claim 1, wherein the receive signal path comprises an automatic gain control (AGC) function, wherein the gain value comprises a maximum gain value that is applied to the automatic gain control function.

3. The method of claim 1, wherein the receive signal path is configured to apply a fixed gain, wherein the gain value comprises a gain value to be used as the fixed gain for the receive signal path.

4. The method of claim 1, wherein the signal is communicated over the wireless channel using a Long Term Evolution (LTE) air interface.

5. The method of claim 1, wherein the estimate of the total noise and interference in the signal received using the receive signal path reflects the total noise and interference in the signal received using the receive signal path over a measurement period.

6. The method of claim 1, wherein determining the estimate of the total noise and interference in the signal received using the receive signal path comprises:
adding together an estimate of a noise floor for the receive signal path, an estimate of external co-channel interference, and an estimate of internal co-channel interference.

7. The method of claim 1, wherein determining the gain value for the receive signal path based on the estimate of the total noise and interference in order to maintain the digital data at the digital set point for the SINR decoded with the highest MCS specified for the wireless channel comprises:
calculating a maximum total mean received power in the receive signal path to maintain the digital data at the digital set point; and
calculating the gain value for receive signal path based on the maximum total mean received power in the receive signal path and an average input power level at the input of the ADC that corresponds to the digital set point.

8. The method of claim 7, wherein calculating the maximum total mean received power in the receive signal path to maintain the digital data at the digital set point comprises:
adding the estimate of the total noise and interference to a maximum required SINR for the wireless signal when all wireless resources are allocated.

9. The method of claim 1, wherein causing the receive signal path to use the gain value as the gain for the receive signal path comprises:
writing the gain value to a gain register associated with the receive signal path.

10. A method of controlling a gain for a receive signal path for receiving a signal communicated over a wireless channel, wherein an input to an analog-to-digital converter (ADC) is generated in the receive signal path, the ADC outputting digital data used for digital signal processing, the method comprising:
repeatedly performing the following:
determining a received signal strength of the signal received at the receive signal path;
determining a gain value for the receive signal path based on the received signal strength that maintains the digital data at a digital set point for a signal-to-interference-plus-noise-ratio (SINR) sufficient to decode the modulation and coding scheme (MCS) specified for the wireless channel; and
causing the receive signal path to use the gain value as the gain for the receive signal path.

11. The method of claim 10, wherein the receive signal path comprises an automatic gain control (AGC) function, wherein the gain value comprises a maximum gain value that is applied to the automatic gain control function.

12. The method of claim 10, wherein the receive signal path is configured to apply a fixed gain, wherein the gain value comprises a gain value to be used as the fixed gain for the receive signal path.

13. The method of claim 10, wherein the signal is communicated over the wireless channel using a Long Term Evolution (LTE) air interface.

14. The method of claim 10, wherein determining the received signal strength of the signal received at receive signal path comprises making several received signal strength measurements and calculating the received signal strength of the signal received at the receive signal path as a function of the received signal strength measurements.

15. The method of claim 10, wherein determining the gain value for the receive signal path based on the received signal strength that maintains the digital data at the digital set point comprises:
  calculating the gain value for receive signal path based on the received signal strength and an average input power level at the input of the ADC that corresponds to the digital set point.

16. The method of claim 10, wherein causing the receive signal path to use the gain value as the gain for the receive signal path comprises:
  writing the gain value to a gain register associated with the receive signal path.

17. A wireless system comprising:
  a radio frequency (RF) front end circuit comprising a receive signal path to receive a signal communicated over a wireless channel;
  an analog-to-digital converter (ADC), wherein an input to the ADC is generated in the receive signal path;
  a baseband modem to perform digital signal processing, wherein the ADC outputs digital data used for the digital signal processing;
  wherein the wireless system is configured to repeatedly perform the following:
    determine an estimate of the total noise and interference in the signal received using the receive signal path;
    determine a gain value for the receive signal path based on the estimate of the total noise and interference in order to maintain the digital data at a digital set point for a signal-to-interference-plus-noise-ratio (SINK) decoded with a highest modulation and coding scheme (MCS) specified for the wireless channel; and
    cause the receive signal path to use the gain value as the gain for the receive signal path.

18. The wireless system of claim 17, wherein the base station system comprises a point-to-multipoint architecture comprising at least one central controller and a plurality of radio points, wherein the central controller is communicatively coupled to the plurality of radio points.

19. The wireless system of claim 18, wherein the baseband modem is implemented at least in part in the controller and at least in part in the radio points.

20. The wireless system of claim 17, wherein the wireless system comprises at least one of a small cell base station, a macro base station, a distributed antenna system (DAS), and a point-to-point architecture comprising a baseband unit (BBU) and a remote radio head (RRH).

21. The wireless system of claim 17, wherein the receive signal path comprises an automatic gain control (AGC) function, wherein the gain value comprises a maximum gain value that is applied to the automatic gain control function.

22. The wireless system of claim 17, wherein the receive signal path is configured to apply a fixed gain, wherein the gain value comprises a gain value to be used as the fixed gain for the receive signal path.

23. The wireless system of claim 17, wherein the wireless system is configured to communicate over the wireless channel using a Long Term Evolution (LTE) air interface.

24. The wireless system of claim 17, wherein the estimate of the total noise and interference in the signal received using the receive signal path reflects the total noise and interference in the signal received using the receive signal path over a measurement period.

25. The wireless system of claim 17, wherein the wireless system is configured to determine the estimate of the total noise and interference in the signal received using the receive signal path by:
  adding together an estimate of a noise floor for the receive signal path, an estimate of external co-channel interference, and an estimate of internal co-channel interference.

26. The wireless system of claim 17, wherein the wireless system is configured to determine the gain value for the receive signal path based on each estimate of the total noise and interference in order to maintain the digital data at the digital set point for the SINR decoded with the highest MCS specified for the wireless channel by:
  calculating a maximum total mean received power in the receive signal path to maintain the digital data at the digital set point; and
  calculating the gain value for receive signal path based on the maximum total mean received power in the receive signal path and an average input power level at the input of the ADC that corresponds to the digital set point.

27. The wireless system of claim 26, wherein the wireless system is configured to calculate the maximum total mean received power in the receive signal path to maintain the digital data at the digital set point by:
  adding the estimate of the total noise and interference to a maximum required signal-to-interference-plus-noise ratio (SINR) for the wireless signal when all wireless resources are allocated.

28. The wireless system of claim 17, wherein the wireless system is configured to cause the receive signal path to use the gain value as the gain for the receive signal path by:
  writing the gain value to a gain register associated with the receive signal path.

29. A wireless system comprising:
  a radio frequency (RF) front end circuit comprising a receive signal path to receive a signal communicated over a wireless channel;
  an analog-to-digital converter (ADC), wherein an input to the ADC is generated in the receive signal path;
  a baseband modem to perform digital signal processing, wherein the ADC outputs digital data used for the digital signal processing;
  wherein the wireless system is configured to repeatedly perform the following:
    determine a received signal strength of the signal received at the receive signal path;
    determine a gain value for the receive signal path based on the received signal strength that maintains the digital data at a digital set point for a signal-to-interference-plus-noise-ratio (SINK) sufficient to decode the modulation and coding scheme (MCS) specified for the wireless channel; and
    cause the receive signal path to use the gain value as the gain for the receive signal path.

30. The wireless system of claim 29, wherein the base station system comprises a point-to-multipoint architecture comprising at least one central controller and a plurality of radio points, wherein the central controller is communicatively coupled to the plurality of radio points.

31. The wireless system of claim 29, wherein the baseband modem is implemented at least in part in the controller and at least in part in the radio points.

32. The wireless system of claim 29, wherein the wireless system comprises at least one of a small cell base station, a macro base station, a distributed antenna system (DAS), and a point-to-point architecture comprising a baseband unit (BBU) and a remote radio head (RRH).

33. The wireless system of claim 29, wherein the receive signal path comprises an automatic gain control (AGC) function, wherein the gain value comprises a maximum gain value that is applied to the automatic gain control function.

34. The wireless system of claim 29, wherein the receive signal path is configured to apply a fixed gain, wherein the gain value comprises a gain value to be used as the fixed gain for the receive signal path.

35. The wireless system of claim 29, wherein the wireless system is configured to communicate over the wireless channel using a Long Term Evolution (LTE) air interface.

36. The wireless system of claim 29, wherein the wireless system is configured to determine the received signal strength of the signal received at receive signal path by:
    making several received signal strength measurements and calculating the received signal strength of the signal received at the receive signal path as a function of the received signal strength measurements.

37. The wireless system of claim 29, wherein the wireless system is configured to determine the gain value for the receive signal path based on the received signal strength that maintains the digital data at the digital set point by:
    calculating the gain value for receive signal path based on the received signal strength and an average input power level at the input of the ADC that corresponds to the digital set point.

38. The wireless system of claim 29, wherein the wireless system is configured to cause the receive signal path to use the gain value as the gain for the receive signal path by:
    writing the gain value to a gain register associated with the receive signal path.

39. A scalable wireless system comprising:
    a controller configured to communicate with a core network, the controller comprising a controller baseband modem;
    a plurality of radio points communicatively coupled to the controller, each of the plurality of radio points comprising:
        a respective radio frequency (RF) front end circuit comprising a respective receive signal path to receive a signal communicated over a wireless channel;
        a respective analog-to-digital converter (ADC), wherein a respective input to the respective ADC is generated in the receive signal path;
        a respective radio-point baseband modem to perform digital signal processing, wherein the respective ADC outputs respective digital data used for the digital signal processing;
    wherein the radio-point baseband modem is configured to:
        autonomously determine, without involvement of controller baseband modem, a gain value for the receive signal path based on a received signal strength that maintains the digital data at a digital set point for a signal-to-interference-plus-noise-ratio (SINK) sufficient to decode the modulation and coding scheme (MCS) specified for the wireless channel; and
        cause the receive signal path to use the gain value as the gain for the receive signal path.

40. The wireless system of claim 39, wherein the gain value is a maximum gain value for the receive signal path.

41. A method of controlling a gain for a receive signal path for receiving a signal communicated over a wireless channel, wherein an input to an analog-to-digital converter (ADC) is generated in the receive signal path, the ADC outputting digital data used for digital signal processing, the method comprising:
    determining an estimate of the total noise and interference in a signal received using the receive signal path; and
    controlling the gain in the receive signal path, based on the estimate of the total noise and interference, in order to limit the gain so as to increase throughput in the wireless channel for burst traffic where high resource block occupancy subframes follow low resource block occupancy subframes.

42. A wireless system comprising:
    a radio frequency (RF) front end circuit comprising a receive signal path to receive a signal communicated over a wireless channel;
    an analog-to-digital converter (ADC), wherein an input to the ADC is generated in the receive signal path;
    a baseband modem to perform digital signal processing, wherein the ADC outputs digital data used for the digital signal processing;
    wherein the wireless system is configured to:
        determine an estimate of the total noise and interference in the signal received using the receive signal path; and
        control the gain in the receive signal path, based on the estimate of the total noise and interference, in order to limit the gain so as to increase throughput in the wireless channel for burst traffic where high resource block occupancy subframes follow low resource block occupancy subframes.

43. A method of controlling a gain for a receive signal path for receiving a signal communicated over a wireless channel, wherein an input to an analog-to-digital converter (ADC) is generated in the receive signal path, the ADC outputting digital data used for digital signal processing, the method comprising:
    determining a received signal strength of the signal received at the receive signal path; and
    controlling the gain in the receive signal path, based on the received signal strength, in order to limit the gain so as to increase throughput in the wireless channel for burst traffic where high resource block occupancy subframes follow low resource block occupancy subframes.

44. A wireless system comprising:
    a radio frequency (RF) front end circuit comprising a receive signal path to receive a signal communicated over a wireless channel;
    an analog-to-digital converter (ADC), wherein an input to the ADC is generated in the receive signal path;
    a baseband modem to perform digital signal processing, wherein the ADC outputs digital data used for the digital signal processing;
    wherein the wireless system is configured to:
        determine a received signal strength of the signal received at the receive signal path; and
        control the gain in the receive signal path, based on the received signal strength, in order to limit the gain so as to increase throughput in the wireless channel for burst traffic where high resource block occupancy subframes follow low resource block occupancy subframes.

* * * * *

UNITED STATES PATENT AND TRADEMARK OFFICE
CERTIFICATE OF CORRECTION

PATENT NO. : 11,212,758 B2
APPLICATION NO. : 16/085526
DATED : December 28, 2021
INVENTOR(S) : Charipadi et al.

It is certified that error appears in the above-identified patent and that said Letters Patent is hereby corrected as shown below:

In the Claims

At Column 23, Line 32, please replace "(SINK)" with -- (SINR) --
At Column 24, Line 52, please replace "(SINK)" with -- (SINR) --
At Column 25, Line 57, please replace "(SINK)" with -- (SINR) --

Signed and Sealed this
Third Day of January, 2023

Katherine Kelly Vidal
*Director of the United States Patent and Trademark Office*